United States Patent
Aoki et al.

(10) Patent No.: US 12,072,155 B2
(45) Date of Patent: Aug. 27, 2024

(54) HEAT EXCHANGER HAVING CURED EDGE

(71) Applicants: NIPPON LIGHT METAL COMPANY, LTD., Tokyo (JP); FUJI ELECTRIC CO., LTD., Kanagawa (JP); KOJIN CO., LTD., Toyama (JP)

(72) Inventors: Akihito Aoki, Shizuoka (JP); Eiji Anzai, Shizuoka (JP); Yoshinari Ikeda, Matsumoto (JP); Hiromichi Gohara, Matsumoto (JP); Ryoichi Kato, Matsumoto (JP); Michihiro Inaba, Toyama (JP); Tetsuya Sunago, Toyama (JP)

(73) Assignees: NIPPON LIGHT METAL COMPANY, LTD., Tokyo (JP); FUJI ELECTRIC CO., LTD., Kanagawa (JP); KOJIN CO., LTD., Toyama (JP)

( * ) Notice: Subject to any disclaimer, the term of this patent is extended or adjusted under 35 U.S.C. 154(b) by 28 days.

(21) Appl. No.: 17/472,509

(22) Filed: Sep. 10, 2021

(65) Prior Publication Data
US 2022/0082341 A1    Mar. 17, 2022

(30) Foreign Application Priority Data
Sep. 15, 2020 (JP) .................. 2020-154798

(51) Int. Cl.
*F28F 9/02* (2006.01)
*F28F 1/02* (2006.01)
*H01L 23/367* (2006.01)

(52) U.S. Cl.
CPC .............. *F28F 9/0246* (2013.01); *F28F 1/02* (2013.01); *H01L 23/367* (2013.01)

(58) Field of Classification Search
CPC .................. F28F 1/02; F28F 9/0246
See application file for complete search history.

(56) References Cited

U.S. PATENT DOCUMENTS 5,567,493 A * 10/1996 Imai .................. B29C 48/11
                                                                425/464
5,904,206 A * 5/1999 Kroetsch ............ F28F 9/0224
                                                                165/173

(Continued)

FOREIGN PATENT DOCUMENTS

JP        H08-110191 A      4/1996
JP        H08110191 A   *  4/1996

(Continued)

OTHER PUBLICATIONS

Translation of Japanese Patent Document JP2016070527A entitled Translation—JP2016070527A (Year: 2023).*

(Continued)

*Primary Examiner* — Paul Alvare
(74) *Attorney, Agent, or Firm* — Rimon P.C.

(57) ABSTRACT

A cooling device includes a body having a flow passage for a heating medium that passes through the body, a first header made of a resin that has an inlet and covers a first end, and a second header made of a resin that has an outlet and covers a second end. The body has a front face, a back face, a first side face, and a second side face. The body and the first header are bonded to a first bonding face, a second bonding face, a third bonding face, and a fourth bonding face. The third bonding face is a curved surface that protrudes toward a +Y side. The fourth bonding face is a curved surface that protrudes toward a -Y side.

16 Claims, 8 Drawing Sheets

(56) References Cited

U.S. PATENT DOCUMENTS

| | | | | |
|---|---|---|---|---|
| 2003/0131981 A1* | 7/2003 | Kohler | ............... | F28F 1/022 |
| | | | | 165/178 |
| 2015/0217545 A1* | 8/2015 | Endo | ............ | B29C 65/8215 |
| | | | | 156/151 |
| 2016/0211558 A1* | 7/2016 | Ma | ................ | H01M 10/654 |
| 2017/0196127 A1* | 7/2017 | Seidl | ............... | F28F 21/067 |
| 2017/0336008 A1* | 11/2017 | Hankins | ............ | F16L 33/34 |

FOREIGN PATENT DOCUMENTS

| | | | | |
|---|---|---|---|---|
| JP | H11342517 A | * | 12/1999 | |
| JP | H11342517 A | * | 12/1999 | |
| JP | 2006-145096 A | | 6/2006 | |
| JP | 2007248014 A | * | 9/2007 | ........... F28F 1/02 |
| JP | 2016-070527 A | | 5/2016 | |
| JP | 2016070527 A | * | 5/2016 | ......... B29C 45/14 |

OTHER PUBLICATIONS

Translation of JPH11342517A named Translation—JPH11342517A (Year: 2023).*

Translation of JPH08110191A named Translation—JPH08110191A (Year: 2023).*

Office Action dated on Feb. 20, 2024 issued in the corresponding Japanese Patent Application No. 2020-154798, w/ English Translation.

\* cited by examiner

HEAT EXCHANGER HAVING CURED EDGE

CROSS-REFERENCE TO RELATED APPLICATIONS

This application claims priority from Japanese Application No. 2020-154798, filed on Sep. 15, 2020, the contents of which are incorporated by reference herein in its entirety.

BACKGROUND

1. Technical Field

The present disclosure relates to a heat exchanger.

2. Description of the Related Art

For example, a heat exchanger includes a body made of a metal that has a flow passage therein, a first header made of a resin that is bonded to an end of the body and has an inlet, and a second header made of a resin that is bonded to another end of the body and has an outlet, as described in Japanese Patent Application Laid-open No. 2016-70527. The body made of a metal has a front face, a back face, and side faces, which are each a flat plane. The first header and the body are bonded to each other by injection molding, thermocompression bonding, or heat sealing.

In Japanese Patent Application Laid-open No. 2016-70527, a corner between the front face and each of the side faces and a corner between the back face and each of the side faces of the body are a curved corner having a small radius of curvature. Therefore, when the temperature of the heat exchanger is increased, a resin portion of the first header or the second header that is bonded to the front face of the body is expanded toward a front side, the resin portion that is bonded to the back face is expanded toward a back side, and the resin portion that is bonded to each of the side faces is expanded toward a lateral side. Expansion directions of the resin portion that is bonded to the corner between the front face and each of the side faces of the body from the front side to the lateral side are abruptly changed. Expansion directions of the resin portion that is bonded to the corner between the back face and each of the side faces of the body from the back side to the lateral side are abruptly changed. Therefore, when the temperature of the heat exchanger is changed, damage such as a crack may be generated at the resin portion that is bonded to the corner between the front face and each of the side faces and the resin portion that is bonded to the corner between the back face and each of the side faces of the body, to reduce airtightness.

SUMMARY

It is an object of the present disclosure to at least partially solve the problems in the conventional technology.

To achieve the above object, a heat exchanger according to an embodiment of the present disclosure includes a body made of a metal and having a flow passage for a heating medium that passes through the body in a first direction, and a first header made of a resin that has a first port as one of an inlet and an outlet that are connected to the flow passage, and covers a first end positioned on one side of the body in the first direction. The body has a front face extending in a second direction that is intersected with the first direction, and the first direction, a back face on a side opposite to the front face in a third direction that is intersected with both the first direction and the second direction, a first side face that is on one side of the second direction, and is connected to a first edge of the front face and a first edge of the back face, and a second side face that is on another side of the second direction, and is connected to a second edge of the front face and a second edge of the back face. The body and the first header are bonded to a first bonding face as a part of the front face, a second bonding face as a part of the back face, a third bonding face as a part of the first side face, and a fourth bonding face as a part of the second side face, the third bonding face is a curved surface that protrudes in the second direction further than the first edge of the front face and the first edge of the back face, and the fourth bonding face is a curved surface that protrudes in the second direction further than the second edge of the front face and the second edge of the back face.

The above and other objects, features, advantages and technical and industrial significance of this disclosure will be better understood by reading the following detailed description of presently preferred embodiments of the disclosure, when considered in connection with the accompanying drawings.

DETAILED DESCRIPTION OF THE PREFERRED EMBODIMENTS

Figure 1:
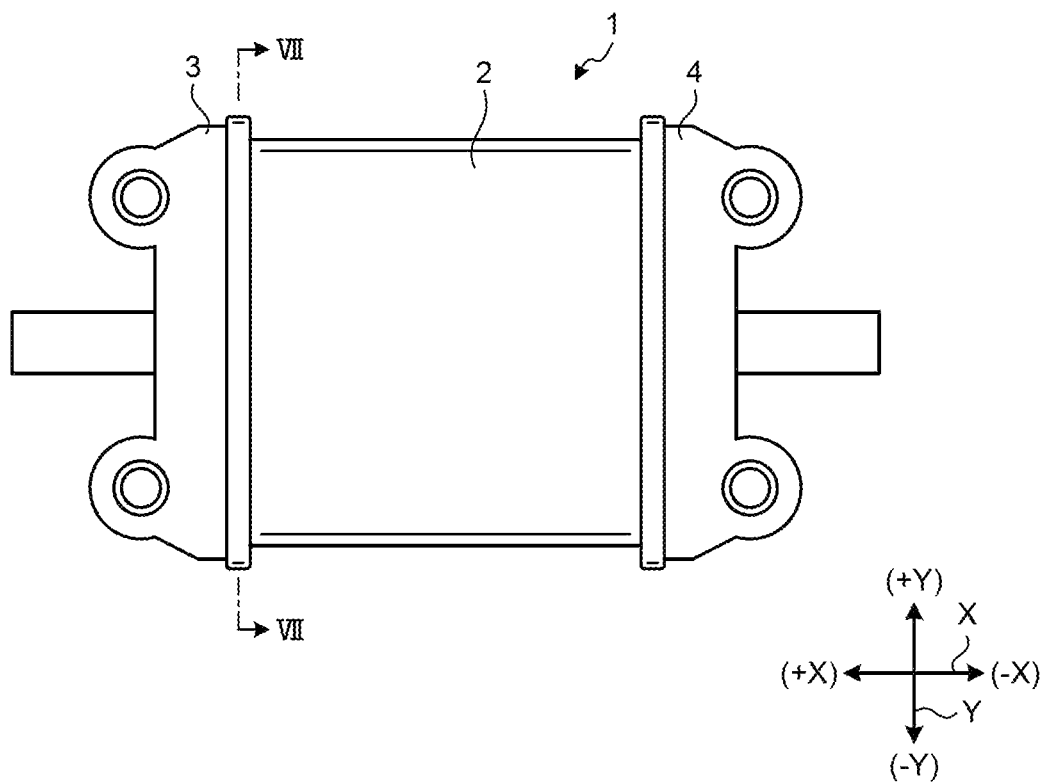
FIG. 1 is a schematic plane view illustrating a cooling device according to an embodiment.

Hereinafter, embodiments will be described in detail with reference to the drawings. Constituents in the following embodiments include those that can be easily assumed by those skilled in the art, those that are substantially equivalent, and so-called equivalents thereof. In the drawings, X represents a first direction, Y represents a second direction, and Z represents a third direction. +X represents one side of the first direction, -X represents another side of the first direction, +Y represents one side of the second direction, -Y represents another side of the second direction, +Z represents one side of the third direction, and -Z represents another side of the third direction. Furthermore, the second direction Y is orthogonal to (intersected with) the first direction X, and the third direction Z is orthogonal to (intersected with) both the first direction X and the second direction Y.

Figure 2:
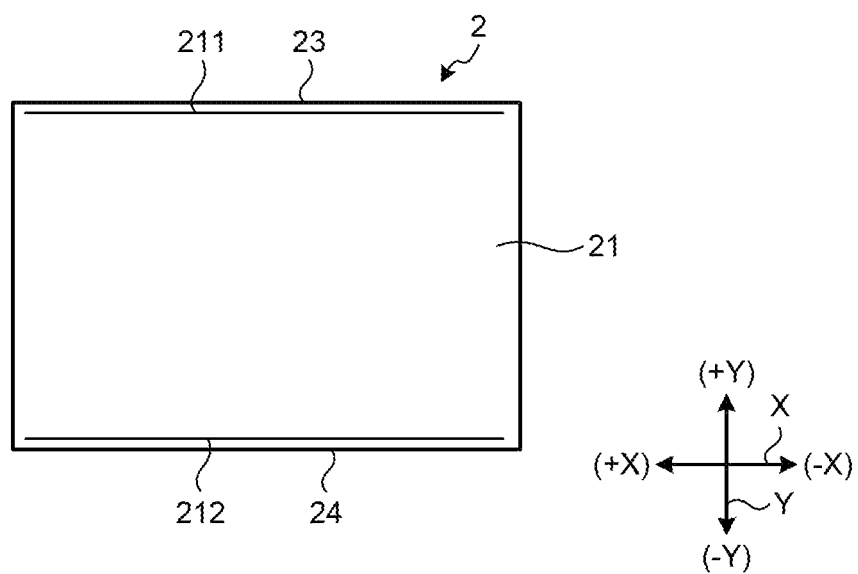
FIG. 2 is a schematic plane view illustrating a body made of a metal, according to the embodiment.
Figure 3:
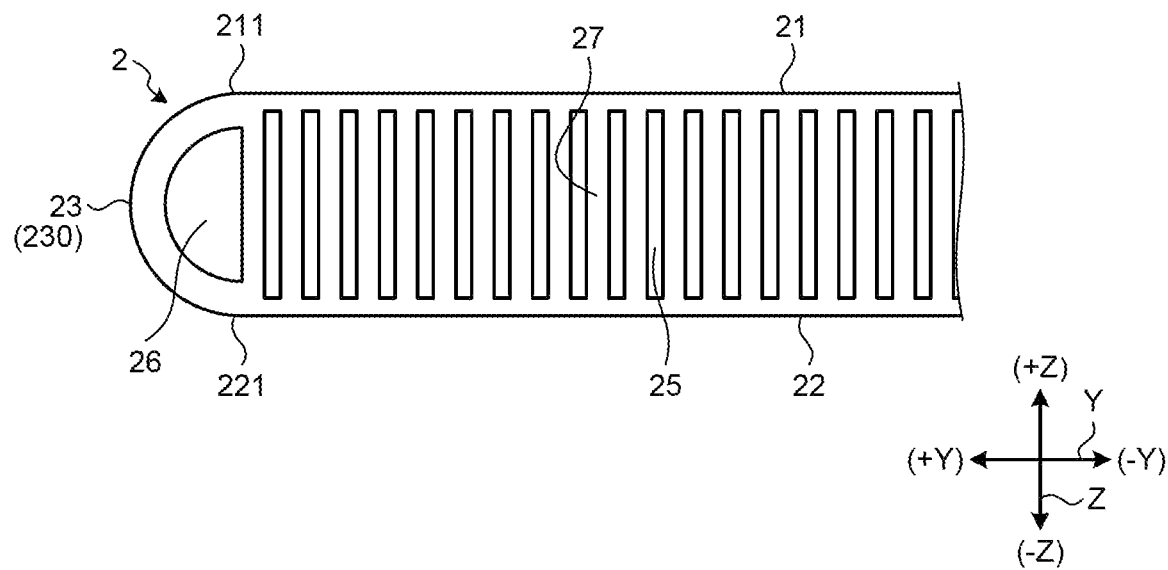
FIG. 3 is a front view of the body in FIG. 2 as viewed in a first direction.
Figure 4:
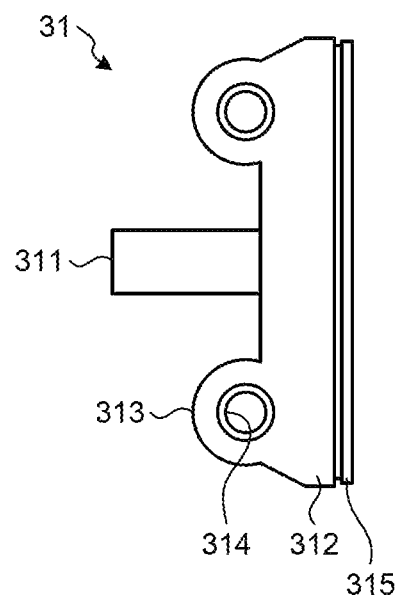
FIG. 4 is a schematic plane view illustrating a first cylindrical body of a first header in FIG. 1.
Figure 5:
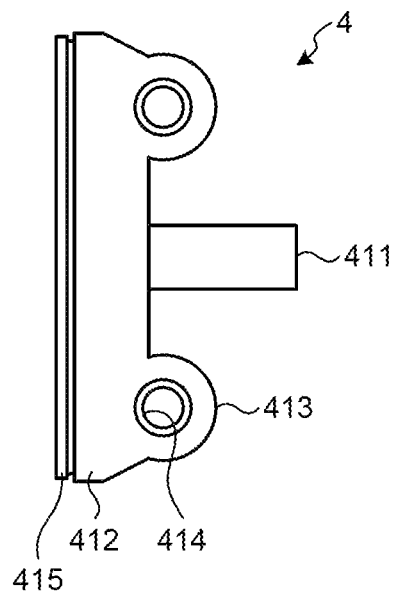
FIG. 5 is a schematic plane view illustrating a first cylindrical body of a second header in FIG. 1.
Figure 6:
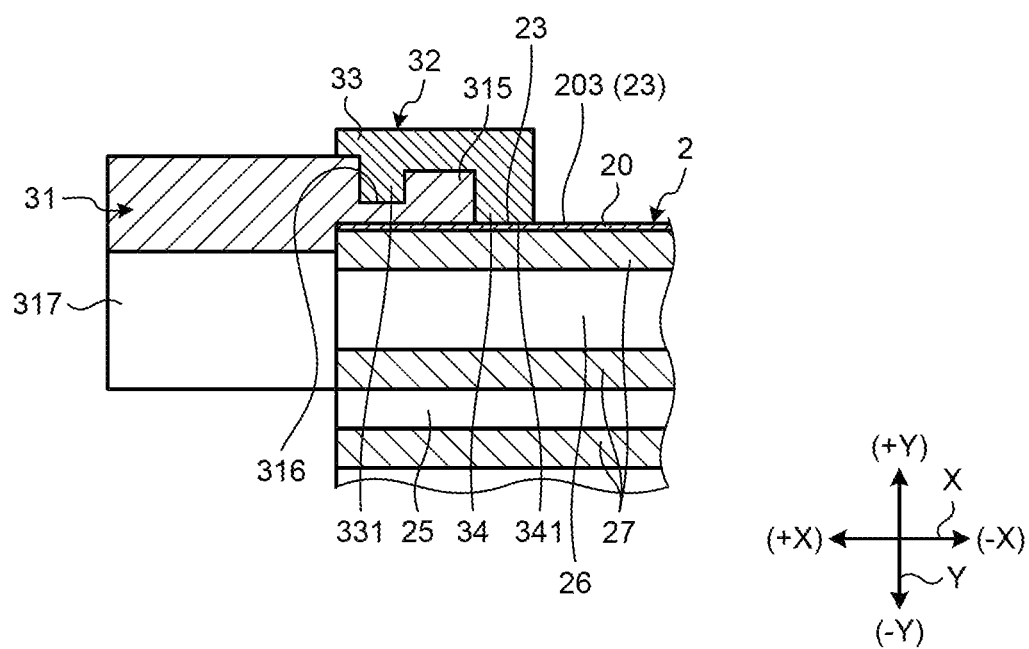
FIG. 6 is an enlarged cross-sectional view of a joint between the first header and the body.
Figure 7:
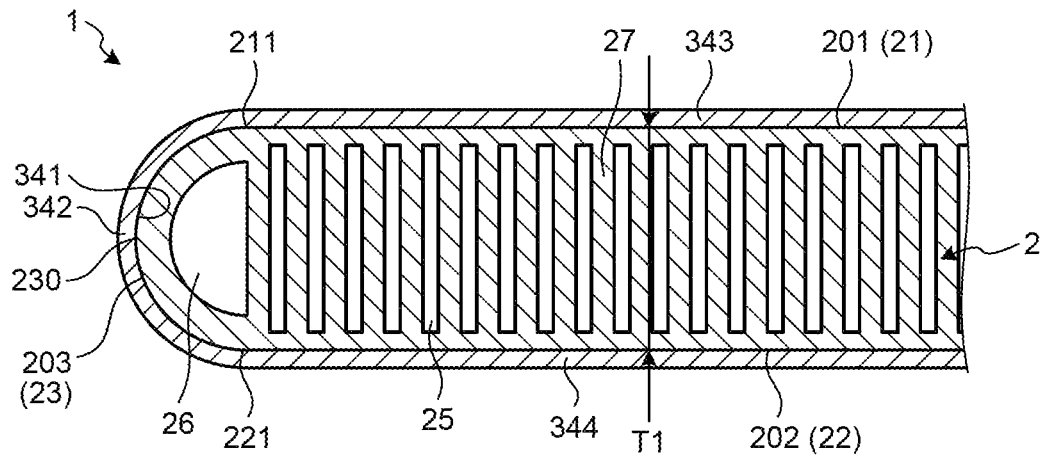
FIG. 7 is a cross-sectional view taken along line VII-VII in FIG. 1.
Figure 7:
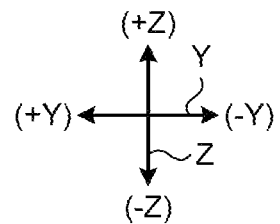
Figure 8:
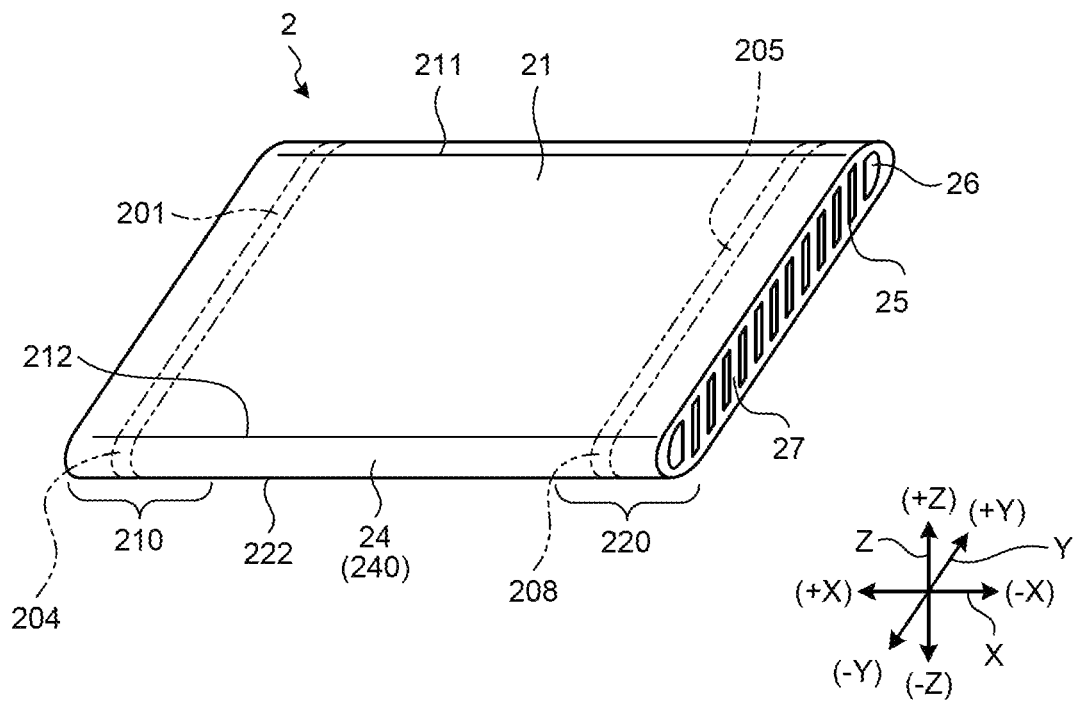
FIG. 8 is a schematic perspective view of the body according to the embodiment as a front face side of the body is viewed obliquely from above.
Figure 9:
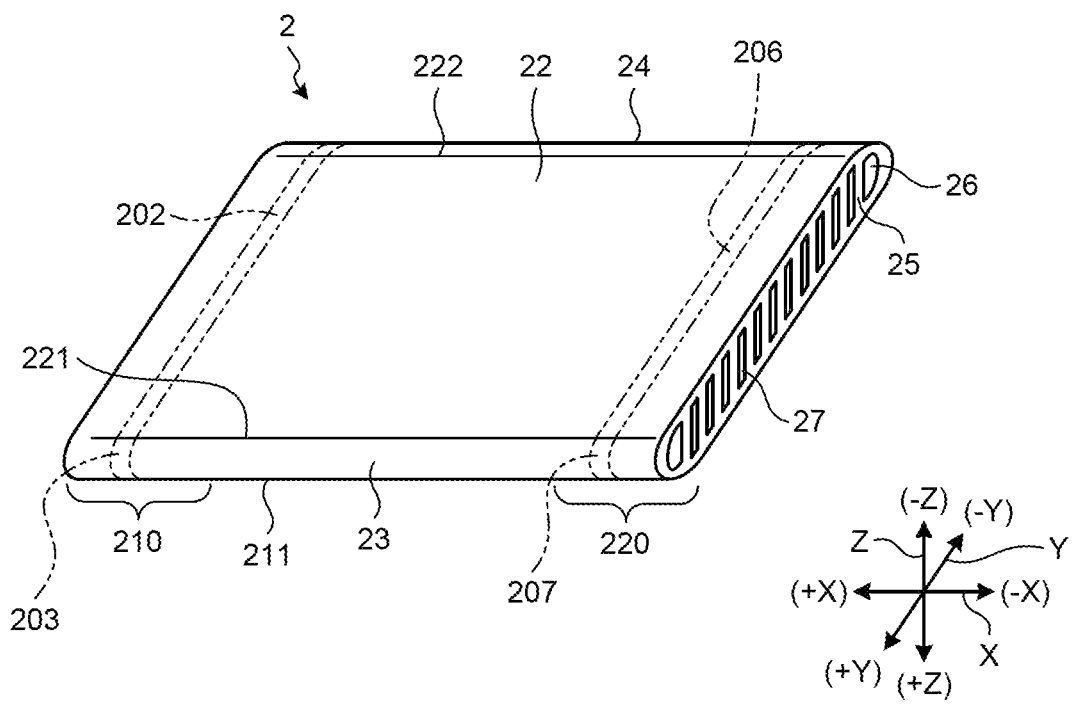
FIG. 9 is a schematic perspective view of the body according to the embodiment as a back face side of the body is viewed obliquely from above.

A cooling device according to the embodiment will be first described. The cooling device is one example of a heat exchanger. A heat exchanger according to the embodiment is not limited to the cooling device. FIG. 1 is a schematic plane view illustrating the cooling device according to the embodiment. FIG. 2 is a schematic plane view illustrating a body made of a metal, according to the embodiment. FIG. 3 is a front view of the body in FIG. 2 as viewed in the first direction. FIG. 4 is a schematic plane view illustrating a first cylindrical body of a first header in FIG. 1. FIG. 5 is a schematic plane view illustrating a first cylindrical body of a second header in FIG. 1. FIG. 6 is an enlarged cross-sectional view of a joint between the first header and the body. FIG. 7 is a cross-sectional view taken along line VII-VII in FIG. 1. FIG. 8 is a schematic perspective view of the body according to the embodiment as a front face side of the body is viewed obliquely from above. FIG. 9 is a schematic perspective view of the body according to the embodiment as a back face side of the body is viewed obliquely from above.

As illustrated in FIG. 1, a cooling device 1 (heat exchanger) includes a body 2 made of a metal, a first header 3, and a second header 4. For example, the cooling device 1 (heat exchanger) is applicable to cooling of electronic devices such as a semiconductor part, but a subject to be cooled is not limited to the electronic devices. A material for the body 2 is, for example, aluminum or an aluminum alloy.

As illustrated in FIGS. 1 to 3, and 7 to 9, the body 2 has a front face 21, a back face 22, a first side face 23, and a second side face 24. The front face 21 is a flat plane extending in both the first direction X and the second direction Y. The front face 21 has a rectangular shape as viewed in a plan view. An edge of the front face 21 on a +Y side of the direction Y is a first edge 211, and an edge of the front face 21 on a -Y side of the direction Y is a second edge 212. The first edge 211 and the second edge 212 extend in the direction X.

The back face 22 is a flat plane positioned on a side opposite to the front face 21 in the third direction Z. The first edge 211 of the front face 21 is connected to a first edge 221 of the back face 22 through the first side face 23. The second edge 212 of the front face 21 is connected to a second edge 222 of the back face 22 through the second side face 24. The first side face 23 and the second side face 24 extend in the direction X.

As illustrated in FIG. 7, flow passages 25 and 26 for a heating medium pass through the body 2 in the first direction X. The flow passage 26 has a semicircular shape as viewed in the first direction X. The flow passage 26 is positioned on ends on the +Y side and the -Y side. The flow passage 25 has a long rectangular shape as viewed in the first direction X. The flow passage 25 is positioned at equal intervals from the +Y side to the -Y side. A partition 27 is provided between a pair of the flow passages 25 and 25 that are adjacent in the second direction Y. Specifically, the flow passages 25 and the partitions 27 are alternately arranged as viewed in the second direction Y.

Furthermore, as illustrated in FIGS. 7 and 9, the first side face 23 is a curved surface that protrudes toward the +Y side. Specifically, as illustrated in FIG. 9, a third bonding face 203 and a seventh bonding face 207 (the details will be described below) that are a part of the first side face 23 have an arc shape that protrudes toward the +Y side (the outside of the body) as viewed in the first direction X. As illustrated in FIG. 8, the second side face 24 is a curved surface that protrudes toward the -Y side. Specifically, a fourth bonding face 204 and an eighth bonding face 208 (the details will be described below) that are a part of the second side face 24 have an arc shape that protrudes toward the -Y side (the outside of the body) as viewed in the first direction X.

As illustrated in FIGS. 4 and 6, the first header 3 includes a first cylindrical body 31 and a second cylindrical body 32. A material for the first header 3 is, for example, a resin, and specifically, a resin containing fibers. As the resin, for example, a polyphenylene sulfide (PPS) resin can be used. As the fibers, for example, glass fibers can be used. The first cylindrical body 31 has an inlet (first port) 311 and a base 312. The inlet (first port) 311 has a cylindrical shape that extends in the first direction X. The inlet 311 is integrally molded with the base 312. In the base 312, a pair of mounting parts 313 are provided on the +Y side and the -Y side. In the mounting parts 313, a through hole is provided. To the through hole, a metal ring 314 is fit. The first header 3 can be fixed on a mounted member or the like by inserting a fastener into the inner circumferential side of the ring 314.

As illustrated in FIG. 6, a communication passage 317 is provided in the inside of the base 312, and is connected to the flow passages 25 and 26 of the body 2. Thus, a heating medium that flows into the inlet 311 flows through the communication passage 317 into the flow passage 25 and 26. On an external surface of the base 312, a protrusion 315 and a groove 316 are provided. The protrusion 315 and the groove 316 extend over the whole circumference of the first cylindrical body 31 in the second direction Y and the third direction Z. The second cylindrical body 32 has a cover 33 and a bonding part 34. On an inner circumferential surface of the cover 33, a protrusion 331 that protrudes toward an inner circumferential side is provided. With the cover 33, the outside of the first cylindrical body 31 is covered. The protrusion 331 is fit to the groove 316. The bonding part 34 is integral with the cover 33. The inner circumferential surface of the bonding part 34 is a bonding face 341. Herein, on the whole external surface of the body 2, that is, the whole of surface layers of the front face 21, the back face 22, the first side face 23, and the second side face 24, a reactive film 20 having reactivity with a resin is formed. For example, the reactive film is a boehmite film. Therefore, as illustrated in FIG. 6, the reactive film 20 is also provided on a surface layer of the third bonding face 203, and the reactive film 20 is bonded to the bonding face 341 of the bonding part 34.

As illustrated in FIGS. 8 and 9, a first end 210 is an end on the +X side, and a second end 220 is an end on the -X side in the body 2. A first bonding face 201 is positioned on the +X side of the front face 21, a second bonding face 202 is positioned on the +X side of the back face 22, the third bonding face 203 is positioned on the +X side of the first side face 23, and the fourth bonding face 204 is positioned on the +X side of the second side face 24. Herein, the width of the fourth bonding face 204 in the direction X is, for example, 2 mm. For example, the distance between the end of the fourth bonding face 204 on the +X side and the end of the second side face 24 on the +X side is 6 mm. For bonding faces other than the fourth bonding face 204, the same width as the width of the fourth bonding face 204 can be set. The distance between the end of each of the bonding faces other than the fourth bonding face 204 and the end of the body 2 in the direction X can be set to 6 mm. On the other hand, a fifth bonding face 205 is positioned on the −X side of the front face 21, a sixth bonding face 206 is positioned on the −X side of the back face 22, the seventh bonding face 207 is positioned on the −X side of the first side face 23, and the eighth bonding face 208 is positioned on the −X side of the second side face 24. The first header 3 has a cylindrical shape covering the outside of the first end 210 of the body 2 and having a bottom. The first bonding face 201 to the fourth bonding face 204 are bonded to the first header 3.

The second header 4 includes a third cylindrical body 41 and a fourth cylindrical body (not illustrated in the drawings). A material for the second header 4 is, for example, a resin, and specifically, a resin containing fibers. As the resin, for example, a polyphenylene sulfide (PPS) resin can be used. As the fibers, for example, glass fibers can be used. The third cylindrical body 41 has an outlet (second port) 411 and a base 412. The outlet (second port) 411 has a cylindrical shape that extends in the first direction X. The outlet 411 is integrally molded with the base 412. In the base 412, a pair of mounting parts 413 are provided on the +Y side and the −Y side. In the mounting parts 413, a through hole is provided. To the through hole, a metal ring 414 is fit.

With reference to FIG. 7, a cross-sectional shape of the body 2 in the vicinity of the first side face 23 will be described. In particular, as illustrated in FIG. 6, the reactive film 20 is formed on the surface layer on the whole external surface of the body 2, but the description of the reactive film 20 is omitted in the following description. To the first bonding face 201 on the front face 21 of the body 2, an upper bonding part 343 that is a part of the bonding part 34 of the first header 3 is bonded. To the second bonding face 202 on the back face 22 of the body 2, a lower bonding part 344 that is a part of the bonding part 34 of the first header 3 is bonded. To the third bonding face 203 on the first side face 23 of the body 2, a lateral bonding part 342 that is a part of the bonding part 34 of the first header 3 is bonded. Specifically, the bonding face 341 that is an inner circumferential surface of the lateral bonding part 342 is bonded to the third bonding face 203. As described above, the first side face 23 is a curved surface that protrudes toward the +Y side, and specifically, an arc cross section that protrudes toward the +Y side (the outside of the body). The lateral bonding part 342 also has a shape following the first side face 23. Specifically, the lateral bonding part 342 is a curved surface that protrudes toward the +Y side, and specifically, an arc cross section that protrudes toward the +Y side. In other words, the third bonding face 203 is a curved surface that protrudes in the second direction Y further than the first edge 211 of the front face 21 and the first edge 221 of the back face 22, and the fourth bonding face 204 is a curved surface that protrudes in the second direction Y further than the second edge 212 of the front face 21 and the second edge 222 of the back face 22. As illustrated in FIG. 7, among portions of the first side face 23, a center 230 in the third direction Z protrudes farthest outwards in the second direction Y. As illustrated in FIG. 8, among portions of the second side face 24, a center 240 in the third direction Z protrudes farthest outwards in the second direction Y. The centers are a portion positioned at approximately half of a distance between the front face 21 and the back face 22 (the thickness of the body).

The radius of curvature of a side edge of the first side face 23 and the radius of curvature of the center 230 in the third direction Z among the portions of the first side face 23 are, for example, 5 mm. A first distance T1 (see FIG. 7) between the front face 21 and the back face 22 of the body 2 in the third direction Z is, for example, 10 mm. Therefore, the radius of curvature of the side edge of the first side face 23 and the radius of curvature of the center 230 in the third direction Z among the portions of the first side face 23 are approximately half of the first distance T1 (see FIG. 7) of the body 2.

Similarly, the radius of curvature of a side edge of the second side face 24 and the radius of curvature of the center 240 in the third direction Z among the portions of the second side face 24 are also, for example, 5 mm. Therefore, the radius of curvature of the side edge of the second side face 24 and the radius of curvature of the center 240 in the third direction Z among the portions of the second side face 24 are approximately half of the first distance T1 (see FIG. 7) of the body 2.

As illustrated in FIG. 7, the radius of curvature (e.g., 5 mm) of a portion adjacent to the first edge 211 of the front face 21 among the portions of the third bonding face 203, the radius of curvature (e.g., 5 mm) of a portion adjacent to the first edge 221 of the back face 22 among the portions of the third bonding face 203, and the radius of curvature (e.g., 5 mm) of a portion that protrudes farthest outwards in the second direction Y among the portions of the third bonding face 203 are the same.

Similarly, the radius of curvature (e.g., 5 mm) of a portion adjacent to the second edge 212 of the front face 21 among the portions of the fourth bonding face 204, the radius of curvature (e.g., 5 mm) of a portion adjacent to the second edge 222 of the back face 22 among the portions of the fourth bonding face 204, and the radius of curvature (e.g., 5 mm) of a portion that protrudes farthest outwards in the second direction Y among the portions of the fourth bonding face 204 are the same.

Furthermore, the same as the radius of curvature of the bonding faces of the first header 3 applies to the radius of curvature of the bonding faces of the second header 4. The body 2 and the second header 4 are bonded to the fifth bonding face 205, the sixth bonding face 206, the seventh bonding face 207, and the eighth bonding face 208. The seventh bonding face 207 is a curved surface that protrudes in the second direction Y further than the first edge 211 of the front face 21 and the first edge 221 of the back face 22. The eighth bonding face 208 is a curved surface that protrudes in the second direction Y further than the second edge 212 of the front face 21 and the second edge 222 of the back face 22.

The radius of curvature (e.g., 5 mm) of a portion adjacent to the first edge 211 of the front face 21 among portions of the seventh bonding face 207, the radius of curvature (e.g., 5 mm) of a portion adjacent to the first edge 221 of the back face 22 among the portions of the seventh bonding face 207, and the radius of curvature (e.g., 5 mm) of a portion that protrudes farthest outwards in the second direction Y among the portions of the seventh bonding face 207 are the same. The radius of curvature (e.g., 5 mm) of a portion adjacent to the second edge 212 of the front face 21 among portions of the eighth bonding face 208, the radius of curvature (e.g., 5 mm) of a portion adjacent to the second edge 222 of the back face 22 among the portions of the eighth bonding face 208, and the radius of curvature (e.g., 5 mm) of a portion that protrudes farthest outwards in the second direction Y among the portions of the eighth bonding face 208 are the same.

Next, a method for producing the cooling device 1 according to the embodiment will be simply described. The body 2 is molded by extruding aluminum. Thus, the body 2 made of aluminum and having the flow passages 25 and 26 and the partition 27 as illustrated in FIGS. 8 and 9 is molded. Subsequently, the whole external surface of the body 2 is roughened, and the reactive film 20 having reactivity with a resin is formed on the surface layer. For example, this reactive film 20 has a fastener-like fine concave on the surface thereof. As illustrated in FIG. 6, the first cylindrical body 31 is then fit to the first end 210 of the body 2. The body 2 is put in a mold as it is. Into the outside of the first cylindrical body 31 and the first bonding face 201 to the fourth bonding face 204 of the body 2, as illustrated in FIG. 6, a molten resin is poured, and then cooled and solidified. At that time, when the molten resin is poured into the fastener-like concave of the reactive film 20 of the body 2 and solidified by a technique with PAL-fit (registered trademark), for example, the bonding face 341 of the bonding part 34 of the second cylindrical body 32 is firmly bonded to the reactive film 20 of the body 2. Bonding the body 2 and the second cylindrical body 32 according to the embodiment is not limited to the technique with PAL-fit (registered trademark), and ordinal insert molding may be also applied. Thus, the first header 3 can be bonded to the body 2. Similarly, when the second header 4 is bonded to the body 2, the cooling device 1 can be produced.

Figure 10:
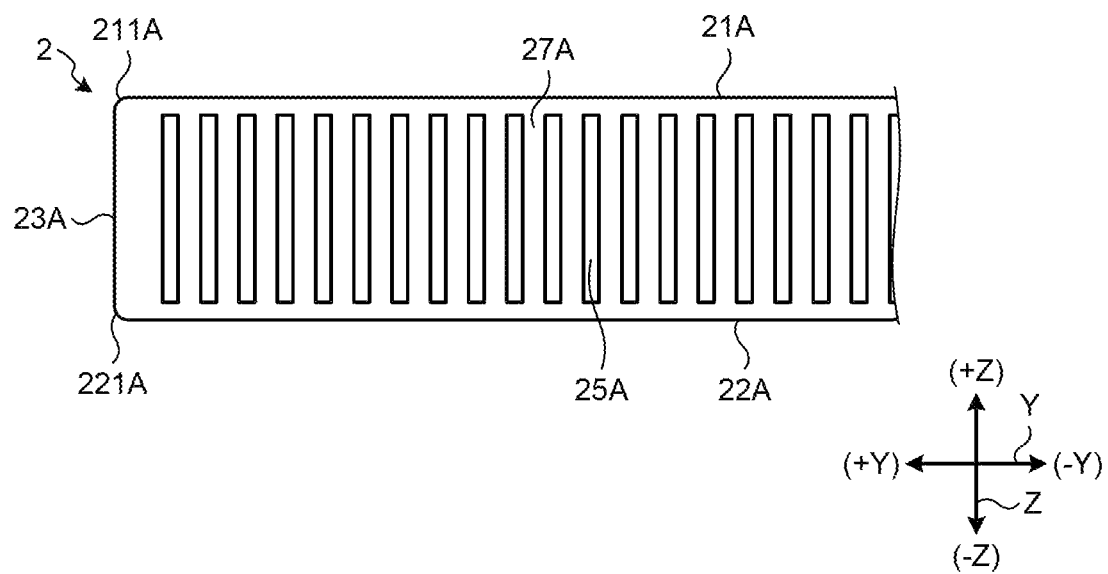
FIG. 10 is a front view of a body according to a comparative example as viewed in a first direction, which is a view corresponding to FIG. 3.
Figure 11:
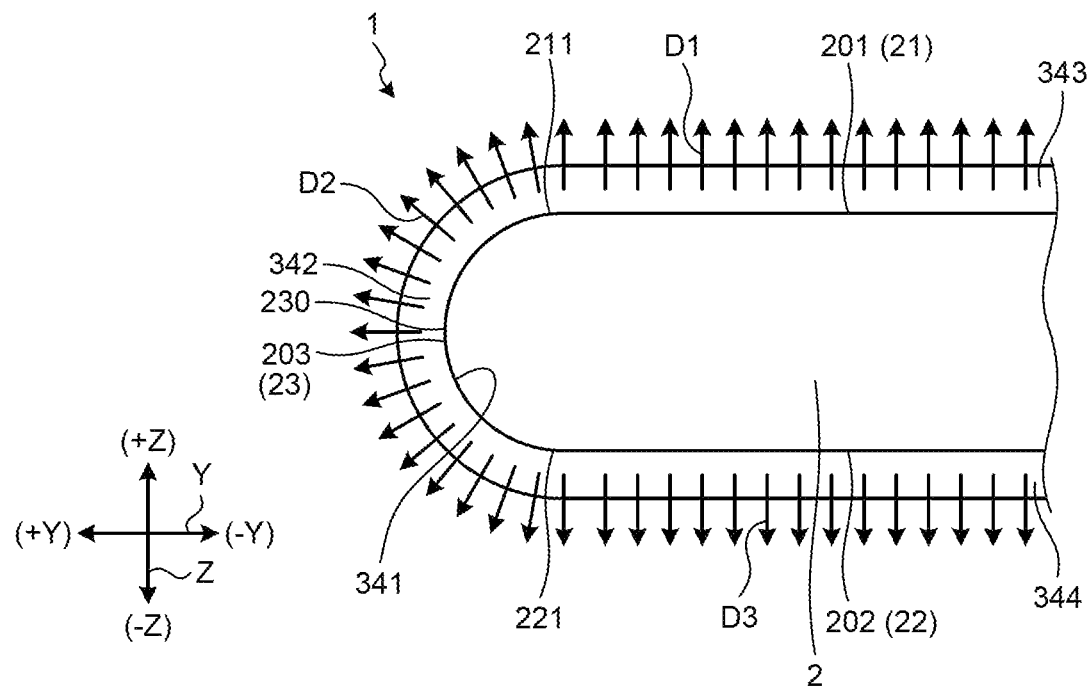
FIG. 11 is a schematic view of FIG. 7, and a direction for expanding a bonding part of the first header during an increase in temperature is represent by an arrow.
Figure 12:
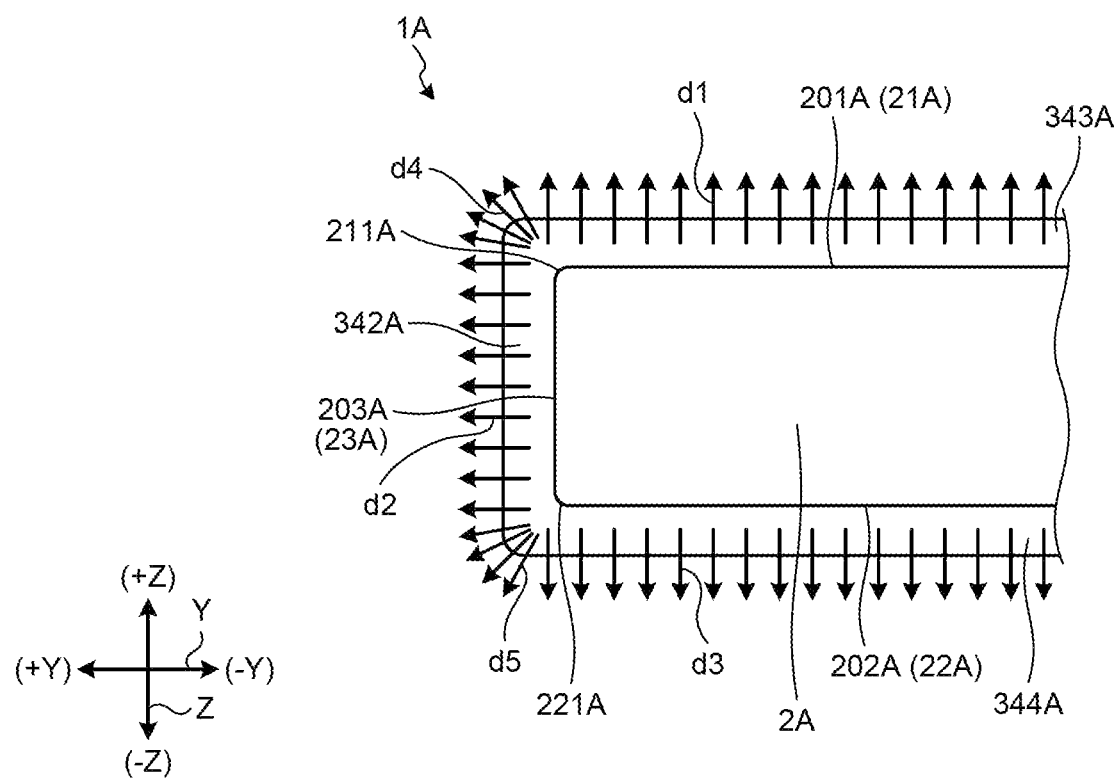
FIG. 12 is a schematic view of a cooling device according to the comparative example, which corresponds to FIG. 11, and a direction for expanding a bonding part of a first header during an increase in temperature is represented by an arrow.

Next, FIG. 10 is a front view of a body according to a comparative example as viewed in the first direction, which is a view corresponding to FIG. 3. FIG. 11 is a schematic view of FIG. 7, and a direction for expanding the bonding part of the first header during an increase in temperature is represent by an arrow. FIG. 12 is a schematic view of a cooling device according to the comparative example, which corresponds to FIG. 11, and a direction for expanding a bonding part of a first header during an increase in temperature is represented by an arrow.

As illustrated in FIG. 10, a body 2A according to the comparative example includes a first flat side face 23A that extends in the third direction, and corners 211A and 221A are a curved corner. The radii of curvature of the curved corners of the corners 211A and 221A are smaller than the radius of curvature of the first side face 23 that has an arc shape as illustrated in FIG. 3.

Next, for the cooling device 1 according to the embodiment and a cooling device 1A according to the comparative example, a mechanism in which the bonding part 34 of the first header 3 is cracked will be simply described. The material for the first header 3 is a resin, and the material for the body 2 is a metal such as aluminum. Therefore, the linear expansion coefficient of the first header 3 is higher than the linear expansion coefficient of the body 2. When the temperature of the cooling device 1 is increased, the first header 3 is expanded more largely than the body 2. Therefore, the first header 3 is expanded outwards so as to be separated from the body 2. The expansion directions of the first header 3 are normal directions of the front face of the first header 3.

In the cooling device 1 according to the embodiment, the first side face 23 and the lateral bonding part 342 have an arc shaped cross section as illustrated in FIG. 11. Therefore, when the temperature of the cooling device 1 is increased, the upper bonding part 343 is expanded toward the +Z side as represented by an arrow D1, and the lower bonding part 344 is expanded toward the −Z side as represented by an arrow D3. Although the lateral bonding part 342 is expanded toward the +Y side as a whole, the expansion directions of the lateral bonding part 342 from a portion facing the first edge 211 to a portion facing the first edge 221 of the back face 22 are gradually changed as represented by an arrow D2. That is, although the expansion directions of the lateral bonding part 342 at the portion facing the first edge 211 are mostly toward the +Z side, the direction of the arrow D2 at a portion having an arc shape of the lateral bonding part 342 is gradually changed from an upward direction to a leftward direction of FIG. 11. Specifically, the expansion directions of the lateral bonding part 342 are radially distributed as represented by the arrow D2.

On the other hand, in the cooling device 1A according to the comparative example, a first side face 23A (bonding face 203A) and a lateral bonding part 342A are flat, as illustrated in FIG. 12. Therefore, when the temperature of the cooling device 1A is increased, an upper bonding part 343A is expanded toward the +Z side as represented by an arrow d1, and a lower bonding part 344A is expanded toward the −Z side as represented by an arrow d3. Although the lateral bonding part 342A is expanded toward the +Y side as a whole, the expansion directions of the lateral bonding part 342A at the corners 211A and 221A are abruptly changed. This is because the radii of curvature of curved corners at the corners 211A and 221A are largely smaller than those in the embodiment. Specifically, an arrow d4 representing the expansion directions at the corner 211A of the lateral bonding part 342A are changed from the arrow d1 to the arrow d2 by 90°. Similarly, an arrow d5 representing the expansion directions at the corner 221A are changed from the arrow d2 to the arrow d3 by 90°. Therefore, the expansion directions of resin of the first header 3 at the corners in the body 2A of the comparative example are abruptly changed as compared with the body 2 of the embodiment. Accordingly, vector directions of stress applied to the resin by expansion are abruptly changed, and therefore the resin is likely to be cracked. In other words, since the lateral bonding part 342 has an arc shape, the expansion directions of the resin in the embodiment are gently changed as compared with the comparative example. Therefore, the resin is unlikely to be cracked.

As illustrated in FIG. 7, the center 230 in the third direction Z among the portions of the first side face 23 protrudes farthest outwards in the second direction Y. As illustrated in FIG. 8, the center 240 in the third direction Z among the portions of the second side face 24 protrudes farthest outwards in the second direction Y. Therefore, the size of expansion of the body 2 on the +Z side is equivalent to the size of expansion of the body 2 on the −Z side, expansion of the entire resin is averaged, and thus the resin is unlikely to be cracked.

Furthermore, the radius of curvature of the side edge of the first side face 23 and the radius of curvature of the center 230 in the third direction Z among the portions of the first side face 23 are approximately half of the first distance T1 (see FIG. 7) of the body 2. The same applies to the second side face 24. Therefore, the side edges of the first side face 23 and the second side face 24 are smoothly connected to the front face 21 and the back face 22 of the body 2.

The radius of curvature (e.g., 5 mm) of the portion adjacent to the first edge 211 of the front face 21 among the portions of the third bonding face 203, the radius of curvature (e.g., 5 mm) of the portion adjacent to the first edge 221 of the back face 22 among the portions of the third bonding face 203, and the radius of curvature (e.g., 5 mm) of the portion that protrudes farthest outwards in the second direction Y among the portions of the third bonding face 203 are the same. Thus, the radii of curvature of main portions of the first side face 23 are the same. Therefore, the size of expansion of the body 2 is made uniform, and the resin is unlikely to be cracked.

Figure 13:
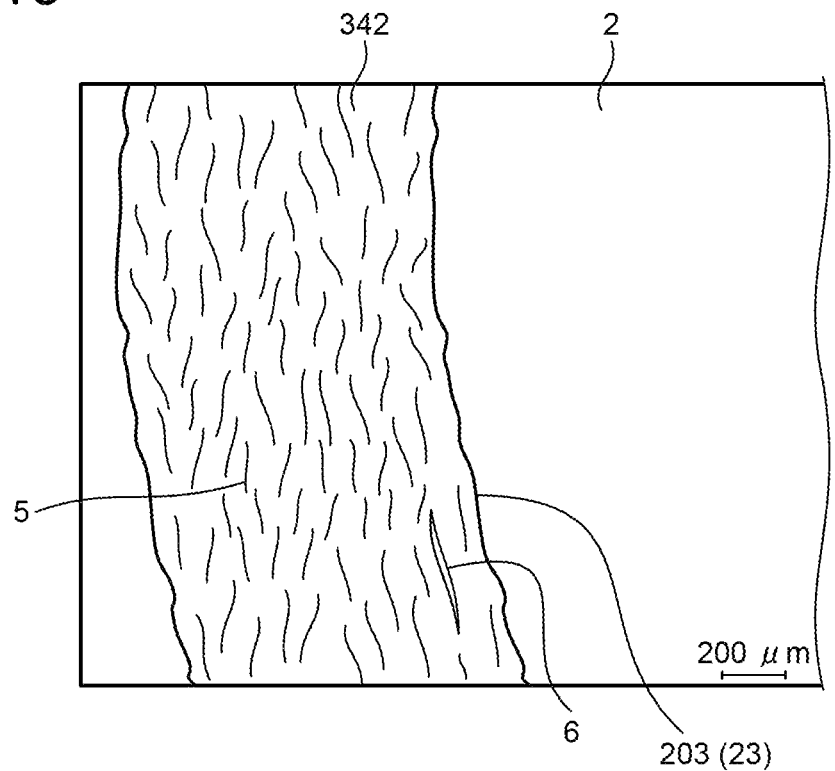
FIG. 13 is an enlarged schematic view of a bonding part of a first header in Examples.
Figure 14:
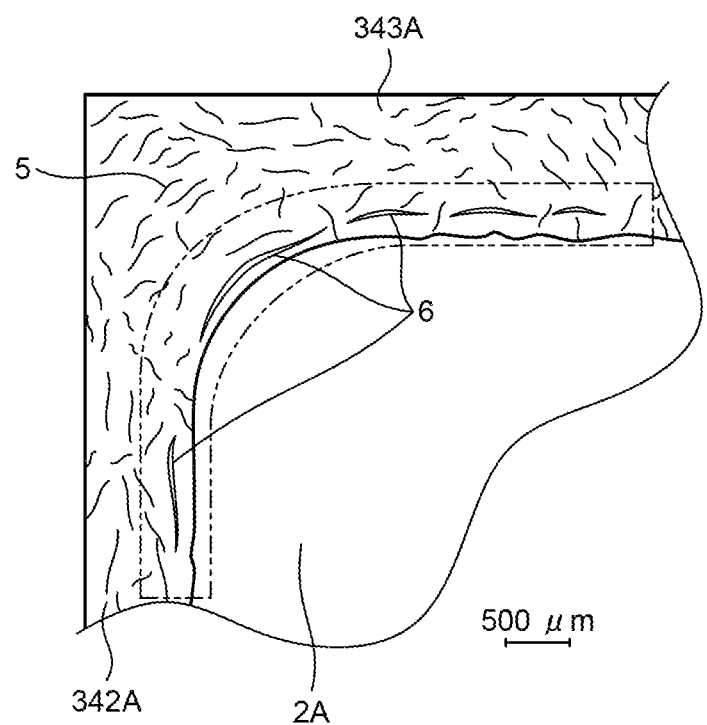
FIG. 14 is an enlarged schematic view of a bonding part of a first header in Comparative Examples.

In at least one of the first header 3 and the second header 4 in the embodiment, a resin matrix may contain fibers 5, as illustrated in FIGS. 13 and 14 described below. Since a material for the fibers 5 is different from a material for the resin matrix, separation (cracking) is especially likely to occur on an interface between the fibers 5 and the resin matrix. Specifically, the linear expansion coefficient of the resin matrix is larger than the linear expansion coefficient of the fibers 5. Therefore, when the fibers 5 and the resin matrix are heated, the fibers 5 cannot follow the expansion of the resin matrix, and separation is likely to occur on the interface between the fibers 5 and the resin matrix. As described above, when the resin matrix contains the fibers 5, cracking of the resin as described in FIG. 12 is further likely to occur. It is preferable that the orientation degree of the fibers 5 in the resin forming at least one of the first header 3 and the second header 4 be 0.60 or more. Herein, the orientation degree of the fibers 5 was analyzed by using software, Moldflow Insight 2019 (Autodesk).

As described above, the cooling device 1 according to the embodiment includes the body 2 in which the flow passages 25 and 26 for a heating medium pass through the body 2, and the first header 3 made of a resin that has the inlet 311 and covers the first end 210. The body 2 has the front face 21, the back face 22, the first side face 23 that is connected to the first edge 211 of the front face 21 and the first edge 221 of the back face 22, and the second side face 24 that is connected to the second edge 212 of the front face 21 and the second edge 222 of the back face 22. The body 2 and the first header 3 are bonded to the first bonding face 201, the second bonding face 202 that is a part of the back face, the third bonding face 203 that is a part of the first side face, and the fourth bonding face 204 that is a part of the second side face. The third bonding face 203 is a curved surface that protrudes in the second direction Y further than the first edge 211 of the front face 21 and the first edge 221 of the back face 22. The fourth bonding face 204 is a curved surface that protrudes in the second direction Y further than the second edge 212 of the front face 21 and the second edge 222 of the back face 22.

Therefore, in the embodiment, there is a merit in which even when the temperature of the cooling device 1 is increased or decreased, damage such as a crack is unlikely to be generated at the first header 3 made of a resin. This will be described in detail below. As illustrated in FIG. 11, when the temperature of the cooling device 1 is increased, the upper bonding part 343 bonded to the front face 21 of the body 2 among the portions of the first header 3 is expanded toward the +Z side as represented by the arrow D1, and the lower bonding part 344 is expanded toward the −Z side as represented by the arrow D3. Although the lateral bonding part 342 is expanded toward the +Y side as a whole, the expansion directions of the lateral bonding part 342 from the portion facing the first edge 211 to the portion facing the first edge 221 of the back face 22 are gradually changed as represented by the arrow D2. That is, although the expansion directions of the lateral bonding part 342 are mostly toward the +Z side at the portion facing the first edge 211, the direction of the arrow D2 at the portions of arc shape of the lateral bonding part 342 is gradually changed from the upward direction to the leftward direction of FIG. 11. Specifically, the expansion directions of the lateral bonding part 342 are radially distributed as represented by the arrow D2.

In contrast, as illustrated in FIG. 12, when the temperature of the cooling device 1A according to the comparative example is increased, the upper bonding part 343A is expanded toward the +Z side as represented by the arrow d1, and the lower bonding part 344A is expanded toward the −Z side as represented by the arrow d3. The arrow d4 representing the expansion directions at the corner 211A of the lateral bonding part 342A is abruptly changed from the arrow d1 to the arrow d2. Similarly, the arrow d5 representing the expansion directions at the corner 221A is abruptly changed from the arrow d2 to the arrow d3. However, since in the embodiment, the lateral bonding part 342 has a curved surface, the expansion directions of the resin are gently changed as compared with the corner of the comparative example. Therefore, the resin is unlikely to be cracked.

The cooling device 1 according to the embodiment includes the second header 4 made of a resin that has the outlet 411 and covers the second end 220. The body 2 and the second header 4 are bonded to the fifth bonding face 205, the sixth bonding face 206, the seventh bonding face 207, and the eighth bonding face 208. The seventh bonding face 207 is a curved surface that protrudes in the second direction Y further than the first edge 211 of the front face 21 and the first edge 221 of the back face 22. The eighth bonding face 208 is a curved surface that protrudes in the second direction Y further than the second edge 212 of the front face 21 and the second edge 222 of the back face 22. Therefore, similarly to the content described about the first header 3, there is a merit in which even when the temperature of the cooling device 1 is changed, damage such as a crack is unlikely to be generated at the second header 4 made of a resin.

The first header 3 includes the first cylindrical body 31 and the second cylindrical body 32. The second cylindrical body 32 has the cover 33 that covers the outside of the first cylindrical body 31, and the bonding part 34 that is bonded to the body 2. Therefore, a part bonded to the body 2 may be only the second cylindrical body 32. Accordingly, as compared with a case where the whole first header 3 is insert-molded in the body 2, bonding can be achieved by a small amount of resin. When a molten resin is cooled, a part of the molten resin is unlikely to suffer from a cooling defect, and a bonding defect is unlikely to be generated.

Since the first header 3 and the second header 4 are the resin containing the fibers 5, the toughness and the strength of the first header 3 and the second header 4 are improved as compared with a resin containing no fibers 5. As described above, in this embodiment, damage such as a crack is unlikely to be generated at the first header 3 and the second header 4 that are the resin containing the fibers 5.

In the flow passages 25 and 26 of the body 2, the partition 27 extending in the first direction X is provided. Therefore, the area that comes into contact with a heating medium is increased, and the cooling efficiency of the cooling device 1 is further improved.

Since the body 2 is aluminum or an aluminum alloy, the weight of the cooling device 1 is reduced. Since aluminum or an aluminum alloy has a thermal conductivity higher than other metals, the cooling efficiency of the cooling device 1 is further improved.

EXAMPLES

Hereinafter, specific examples of the embodiment will be described. A molding condition of a cooling device used in the examples and a molding result will be first described. As illustrated in Table 1 below, in Examples 1 and 2 (the shape of FIG. 3, the radius of curvature of a whole side face was 5 mm, and the thickness of a body in the direction Z was 10 mm), a boehmite treatment was performed as a surface treatment of the body after aluminum of the body was immersed in hydrochloric acid. A first cylindrical body of a first header was fit to the body, and put in the inside of a mold, and the mold is filled with a molten resin. Thus, the first cylindrical body and the body were molded so as to be covered from the outside with a second cylindrical body. A material for the molten resin was a polyphenylene sulfide (PPS) resin. The molten resin contained 50 by volume of fillers, and as a reinforcement, glass fibers. The injection pressure, the injection rate, the dwell, and the injection dwell time of the molten resin are as listed in Table 1. The molding results of the second cylindrical body in Examples 1 and 2 show no generation of damage such as a crack and no leakage.

TABLE 1

| No | Surface treatment of body | Resin | Gate position | Injection pressure MPa | Injection rate mm/sec | Dwell MPa | Injection dwell time sec | Result of thermal shock test −40° c.↔125° c. Retention time: 10 min |
|---|---|---|---|---|---|---|---|---|
| Example 1 | Hydrochloric acid + boehmite treatment | Polyphenylene sulfide (PPS) | One at end | 80 | 50 | 70 | 15 | Leakage occurred at 7,400 cycles |
| Example 2 | | | | 80 | 50 | 70 | 15 | Leakage did not occur at 2,000 cycles. The cooling device was taken out. |

On the other hand, as illustrated in Table 2 below, conditions in Comparative Examples 1, 2, and 3 (the shape of FIG. 10, the radius of curvature at a corner was 2 mm) were the same as the conditions in Examples 1 and 2 except for the dwell of the molten resin. All the molding results of the second cylindrical body show no generation of damage such as a crack and no leakage.

TABLE 2

| No | Surface treatment of body | Resin | Gate position | Injection pressure MPa | Injection rate mm/se c | Dwell MPa | Injection dwell time sec | Result of thermal shock test −40° c.↔125° c. Retention time: 10 min |
|---|---|---|---|---|---|---|---|---|
| Comparative Example 1 | Hydrochloric acid + boehmite treatment | Polyphenylene sulfide (PPS) | One at end | 80 | 50 | 40 | 15 | Leakage occurred at 385 cycles |
| Comparative Example 2 | | | | 80 | 50 | 40 | 15 | Leakage occurred at 400 cycles |
| Comparative Example 3 | | | | 80 | 50 | 40 | 15 | Leakage occurred at 400 cycles |

Subsequently, the cooling devices according to Examples 1 and 2, and Comparative Examples 1, 2, and 3 were subjected to a thermal shock test using a liquid tank type thermal shock tester. For the heat shock test, specifically, each of the cooling devices was held at −40° C. for 10 minutes, and then held at 125° C. for 10 minutes in one cycle. Every 200 cycles, an airtightness test was performed. When airtightness of the cooling device was not good, a leakage portion was observed with a microscope. In the airtightness test, the cooling device was held at 0.5 MPa for 5 minutes, and the presence or absence of leakage was checked.

In Example 1, leakage occurred at 7,400 cycles. In Example 2, leakage did not occur at 2,000 cycles. Therefore, the test was stopped.

In Comparative Example 1, leakage occurred at 385 cycles. As illustrated in FIG. 14, observation was performed with the microscope, and as a result, a long crack 6 following the body was found near a curved corner of the body (a portion surrounded by a two-dot chain line) in a resin layer of the first header. In Comparative Examples 2 and 3, leakage occurred at 400 cycles.

Figure 15:
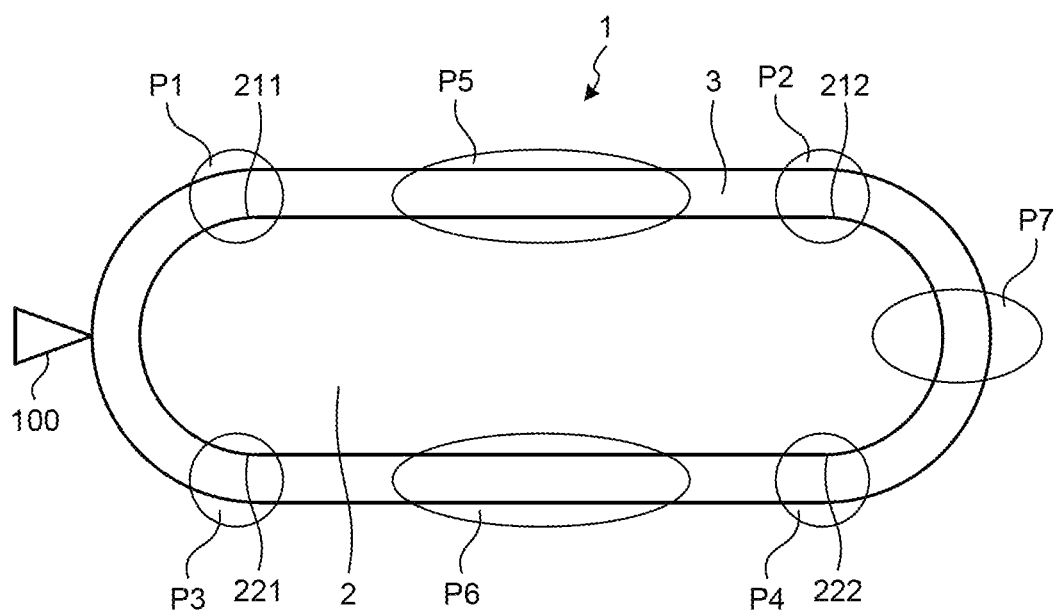
FIG. 15 is a schematic view illustrating portions where the orientation degrees of fibers in the first header in Examples are measured.

Next, the orientation degree of fibers in the resins of the first headers in Example 1 and Comparative Example 1 was measured. FIG. 15 is a schematic view illustrating portions where the orientation degree of fibers in the first header in Examples are measured. In Table 3 below, the orientation degree of fibers at each portion is listed.

TABLE 3

| | Portion | | | | | | |
|---|---|---|---|---|---|---|---|
| | P1 | P2 | P3 | P4 | P5 | P6 | P7 |
| Orientation degree in Example 1 | 0.83 | 0.85 | 0.84 | 0.85 | 0.91 | 0.90 | 0.69 |
| Orientation degree in Comparative Example 1 | 0.68 | 0.69 | 0.70 | 0.52 | 0.89 | 0.89 | 0.50 |

In Example 1, the orientation degree is 0.6 or more at all the portions P1 to P7 of FIG. 15, as listed in Table 3. In contrast, in Comparative Example 1, the orientation degree is less than 0.6 at two portions P4 and P7. At all the portions P1 to P7, the orientation degree in Example 1 is higher than the orientation degree in Comparative Example 1. This demonstrates that in Example 1 in which the orientation degree is higher, the first header is unlikely to be damaged as compared with Comparative Example 1 when expansion and shrinkage due to heat are repeated. In FIG. 15, the mold has a gate 100 in which the molten resin flows, and in both Example 1 and Comparative Example 1, the molten resin was not overflowed.

The above results verify that in Examples 1 and 2, cracking is unlikely to occur over a long period of time and durability is high as compared with Comparative Examples 1, 2, and 3.

The present disclosure can provide a heat exchanger in which damage such as a crack is unlikely to be generated at a header made of a resin that is bonded to a body made of a metal.

Although the disclosure has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A heat exchanger comprising:
   a body made of a metal and having a flow passage for a heating medium, the flow passage extending through the body in a first direction; and
   a first header including a first port as one of an inlet and an outlet that are connected to the flow passage, the first header covering a first end positioned on one side of the body in the first direction, wherein
   the body has:
      a front face extending in the first direction and a second direction intersecting the first direction;
      a back face on a side opposite to the front face in a third direction intersecting both the first direction and the second direction;
      a first side face that is on one side of the second direction, and is connected to a first edge of the front face and a first edge of the back face; and
      a second side face that is on another side of the second direction, and is connected to a second edge of the front face and a second edge of the back face,
   the first header is bonded to the body at a first bonding face being a part of the front face, at a second bonding face being a part of the back face, at a third bonding face being a part of the first side face, and at a fourth bonding face being a part of the second side face,
   the third bonding face is a curved surface that protrudes in the second direction further than the first edge of the front face and the first edge of the back face,
   the fourth bonding face is a curved surface that protrudes in the second direction further than the second edge of the front face and the second edge of the back face,
   the flow passage has a first flow passage that extends through the body along the first direction and is disposed under the first side face such that the first side face overlaps the first flow passage in plan view,
   the first flow passage has a cross-sectional shape consists of a single straight line and a single arch such that the single straight line extends between a first end and a second end of the single arch to form a semicircular shape, the single arch being continuously curved along an entire length of the single arch,
   the first header includes:
      a first portion opposed to a boarder portion of the body between the first bonding face and the first side face;
      a second portion opposed to a boarder portion of the body between the first bonding face and the second side face;
      a third portion opposed to a boarder portion of the body between the second bonding face and the first side face;
      a fourth portion opposed to a boarder portion of the body between the second bonding face and the second side face; and
      a fifth portion opposed to a portion of the body at a middle of the second side face in the third direction,
   the first header is made of a resin containing fibers,
   an alignment degree of the fibers in the first header is 0.60 or more such that 60% or more of the fibers in each of the first to fifth portions of the first header are aligned in a respective first same direction, and
   a gate of the first header to pour the resin is opposed to a portion of the body at a middle of the first side face in the third direction.

2. The heat exchanger according to claim 1, wherein
   a center in the third direction among portions of the first side face protrudes farthest outwards in the second direction, and
   a center in the third direction among portions of the second side face protrudes farthest outwards in the second direction.

3. The heat exchanger according to claim 1, wherein
   a radius of curvature of a side edge of the first side face and a radius of curvature of a center in the third direction among portions of the first side face are approximately half of a first distance between the front face and the back face of the body in the third direction, and
   a radius of curvature of a side edge of the second side face and a radius of curvature of a center in the third direction among portions of the second side face are approximately half of the first distance.

4. The heat exchanger according to claim 1, wherein
   a radius of curvature of a portion adjacent to the first edge of the front face among portions of the third bonding face, a radius of curvature of a portion adjacent to the first edge of the back face among the portions of the third bonding face, and a radius of curvature of a portion that protrudes farthest outwards in the second direction among the portions of the third bonding face are same, and
   a radius of curvature of a portion adjacent to the second edge of the front face among portions of the fourth bonding face, a radius of curvature of a portion adjacent to the second edge of the back face among the portions of the fourth bonding face, and a radius of curvature of a portion that protrudes farthest outwards in the second direction among the portions of the fourth bonding face are same.

5. The heat exchanger according to claim 1, further comprising a second header made of a resin that has a second port as the other of the inlet and the outlet that are connected to the flow passage, and covers a second end positioned on another side of the body in the first direction, wherein
   the second header is bonded to a fifth bonding face as a part of the front face of the body, a sixth bonding face as a part of the back face, a seventh bonding face as a part of the first side face, and an eighth bonding face as a part of the second side face,
   the seventh bonding face is a curved surface that protrudes in the second direction further than the first edge of the front face and the first edge of the back face, and
   the eighth bonding face is a curved surface that protrudes in the second direction further than the second edge of the front face and the second edge of the back face.

6. The heat exchanger according to claim 5, wherein
   the center in the third direction among portions of the first side face protrudes farthest outwards in the second direction, and
   the center in the third direction among portions of the second side face protrudes farthest outwards in the second direction.

7. The heat exchanger according to claim 5, wherein
a radius of curvature of a side edge of the first side face and a radius of curvature of a center in the third direction among portions of the first side face are approximately half of a first distance between the front face and the back face of the body in the third direction, and
a radius of curvature of a side edge of the second side face and a radius of curvature of a center in the third direction among portions of the second side face are approximately half of the first distance.

8. The heat exchanger according to claim 5, wherein
a radius of curvature of a portion adjacent to the first edge of the front face among portions of the seventh bonding face, a radius of curvature of a portion adjacent to the first edge of the back face among the portions of the seventh bonding face, and a radius of curvature of a portion that protrudes farthest outwards in the second direction among the portions of the seventh bonding face are same, and
a radius of curvature of a portion adjacent to the second edge of the front face among portions of the eighth bonding face, a radius of curvature of a portion adjacent to the second edge of the back face among the portions of the eighth bonding face, and a radius of curvature of a portion that protrudes farthest outwards in the second direction among the portions of the eighth bonding face are same.

9. The heat exchanger according to claim 1, wherein the first header has a first cylindrical body that has the first port, covers outside of the first end of the body, and has a bottom, and a second cylindrical body that has a cover covering outside of the first cylindrical body, and a bonding part to be bonded to the body.

10. The heat exchanger according to claim 5, wherein the second header has a third cylindrical body that has the second port, covers outside of the second end of the body, and has a bottom, and a fourth cylindrical body that has a cover covering outside of the third cylindrical body, and a bonding part to be bonded to the body.

11. The heat exchanger according to claim 5, wherein the second header is a resin containing fibers.

12. The heat exchanger according to claim 10, wherein the second header is a resin containing fibers.

13. The heat exchanger according to claim 11, wherein the second header includes:
a first portion opposed to a boarder portion of the body between the fifth bonding face and the first side face;
a second portion opposed to a boarder portion of the body between the fifth bonding face and the second side face;
a third portion opposed to a boarder portion of the body between the sixth bonding face and the first side face;
a fourth portion opposed to a boarder portion of the body between the sixth bonding face and the second side face; and
a fifth portion opposed to a portion of the body at a middle of the second side face in the third direction,
an alignment degree of the fibers of the second header is 0.60 or more such that 60% or more of the fibers in each of the first to fifth of the second header are aligned in a respective second same direction, and
a gate of the second header to pour the resin is opposed to a portion of the body at a middle of the first side face in the third direction.

14. The heat exchanger according to claim 1, wherein the flow passage of the body has a partition extending in the first direction.

15. The heat exchanger according to claim 1, wherein the body is aluminum or an aluminum alloy.

16. The heat exchanger according to claim 1, wherein
the flow passage further has a plurality of second flow passages each extending through the body along the first direction, the second flow passages being disposed closer to a middle of the body in the second direction than the first flow passage is, in the plan view,
the single straight line of the first flow passage has a first length,
each of the second flow passages has a rectangular shape in a cross section perpendicular to the first direction, and
the first length that is a maximum length of the first passage in the third direction is less than a second length that is a length of each of the second passages in the third direction.

* * * * *